United States Patent [19]
Larry

[11] 3,854,957
[45] Dec. 17, 1974

[54] METALLIZATIONS COMPRISING NICKEL OXIDE

[75] Inventor: John Robert Larry, Youngstown, N.Y.

[73] Assignee: E. I. du Pont de Nemours and Company, Wilmington, Del.

[22] Filed: Aug. 28, 1973

[21] Appl. No.: 392,240

[52] U.S. Cl. .................. 106/1, 117/130 E, 117/227
[51] Int. Cl. .............................................. C23c 3/04
[58] Field of Search ............ 106/1; 117/227, 123 B, 117/130 E; 252/514

[56] References Cited

UNITED STATES PATENTS

| | | | |
|---|---|---|---|
| 3,207,706 | 9/1965 | Hoffman | 252/514 |
| 3,615,734 | 10/1971 | Cole | 106/1 |
| 3,674,515 | 7/1972 | Kelemen | 106/1 |

*Primary Examiner*—Lewis T. Jacobs

[57] ABSTRACT

In compositions of noble metal(s) dispersed in an inert vehicle which are useful for forming electrodes on dielectric substrates, improved electrode compositions comprising an amount of NiO effective to increase fired conductor adhesion to substrates; since the resultant fired electrodes have increased adhesion to ceramic dielectric substrates, they have special utility in forming surface metallizations in electronic circuits.

16 Claims, No Drawings

METALLIZATIONS COMPRISING NICKEL OXIDE

BACKGROUND OF THE INVENTION

This invention relates to electronic compositions, and more particularly, to metallizations useful in producing high-adhesion conductors on dielectric substrates.

Metallizations which are fired onto ceramic dielectric substrates to produce conductor patterns usually comprise finely divided noble metals and an inorganic binder, and usually are applied to the substrate as a dispersion of the inorganic powders in an inert liquid medium. The metallic component provides the functional (conductive) utility, while the binder (e.g., glass, $Bi_2O_3$, etc.) bonds metal particles to the substrate and to one another.

Silver (including Pd/Ag) conductor metallizations (glass frit plus noble metal) presently employed in high-performance electronic applications for producing fired conductor patterns on dielectric substrates are often deficient in that high adhesion (initial and thermally aged) is often not obtained. To prevent adhesive failure, leads to conductor patterns are often designed to impart a mechanical strength which compliments the soldered bond strength. This is done by swagging pins in the ceramic substrate prior to soldering or by using clip-on leads. Better adhesion of the conductor pattern to the substrate would eliminate these steps and result in cost savings. Furthermore, in certain applications, not only is a substrate bearing sintered conductors subjected to a subsequent resistor firing step, but also to an encapsulation fire (glass) at about 500°C.; this thermal treatment often leads to poor solderability of conductors located on the substrate.

SUMMARY OF THE INVENTION

This invention provides improved powder metallizations comprising noble metals and binder useful for forming conductor patterns on ceramic dielectric substrates. These improved powder compositions are finely divided, in the sense that they can be printed using conventional screen printing techniques, usually as a dispersion in an inert liquid vehicle, in desired patterns on a substrate and then fired (sintered or cured) to form conductors. The conductors have increased adhesion to the substrate, both initially (after firing) and after thermal aging.

The improved adhesion is due to the essential and novel additive of the present invention, nickel oxide. The amount of nickel oxide in the powder is an amount effective to increase such adhesion to the substrate, and is normally in the range 0.5–10% by weight, preferably 1–4%, based on the weight of the noble metal powder present.

Noble metals are platinum, palladium, gold, silver, ruthenium, and osmium, and mixtures and alloys thereof with one another. Preferred noble metals are platinum, palladium, gold and silver; the optimum noble metal is silver or a mixture of palladium and silver, containing no more than 40% silver.

Also a part of this invention are the resultant fired conductors on dielectric substrates.

DETAILED DESCRIPTION

The essential component in the powder compositions of the present invention is finely divided NiO (nickel oxide). The amount employed is sufficient to increase adhesion of the metallization to the substrate upon firing, without severely decreasing the solderability of the resultant fired conductor. Hence, as a practical upper limit, no more than 10% NiO is used, based on the weight of the noble metal present. Preferably about 1–4% NiO is employed. The minimum amount of NiO employed is that which is effective to increase adhesion of the particular noble metal(s) employed to the substrate; that lower limit in practice is often 0.5% or more.

The compositions of the present invention comprise finely divided inorganic powders dispersed in inert vehicles. The powders are sufficiently finely divided to be used in conventional screen or stencil printing operations, and to facilitate sintering. Generally, the metallizations are such that at least 90% of the particles are no greater than 5 microns. In optimum metallizations substantially all the particles are less than 1 micron in size. Stated another way, the optimum surface area of the particles is greater than about 0.5 $m.^2/g$.

The metallizing compositions are prepared from the solids and vehicles by mechanical mixing. The metallizing compositions of the present invention are printed as a film onto ceramic dielectric substrates in the conventional manner. Generally, screen stenciling techniques are preferably employed.

Any inert liquid may be used as the vehicle. Water or any one of various organic liquids, with or without thickening and/or stabilizing agents and/or other common additives, may be used as the vehicle. Exemplary of the organic liquids which can be used are the aliphatic alcohols; esters of such alcohols, for example, the acetates and propionates; terpenes such as pine oil, terpineol and the like; solutions of resins such as the polymethacrylates of lower alcohols, or solutions of ethyl cellulose, in solvents such as pine oil and the monobutyl ether of ethylene glycol monoacetate. The vehicle may contain or be composed of volatile liquids to promote fast setting after application to the substrate.

The ratio of inert liquid vehicle to solids in the metallizing compositions of this invention may vary considerably and depends upon the manner in which the dispersion of metallizing composition in vehicle is to be applied and the kind of vehicle used. Generally, from 0.5 to 20 parts by weight of solids per part by weight of vehicle will be used to produce a dispersion of the desired consistency. Preferred dispersions contain 30–70% vehicle, and optimum dispersions about 40–60% vehicle.

As indicated above, the metallizing compositions of the present invention are printed onto ceramic substrates, after which the printed substrate is fired to mature (sinter) the metallizing compositions of the present invention, thereby forming continuous conductors on the dielectrics.

The dielectric substrate used in the present invention to make multilayer capacitors may be any dielectric compatible with the electrode composition and firing temperature selected, according to principles well established in the art. Such dielectrics include barium titanate, barium zirconate, lead zirconate, strontium titanate, calcium titanate, calcium zirconate, lead zirconate, lead zirconate titanate, etc. Special advantages as to aged adhesion have been observed where the dielectric is alumina with minor amounts of magnesium silicate and calcium silicate binders.

As indicated above, the metallizing compositions of the present invention are printed onto ceramic substrates, after which the printed substrate is fired to mature the metallizing compositions of the present invention, thereby forming continuous conductors. The printed substrate is fired at a temperature below the melting point of the noble metal used (to prevent loss of pattern definition), at a temperature high enough to mature (sinter) the conductor pattern. For example, with Pd/Ag conductors firing is typically at 750°–950°C. for 5–10 minutes at peak temperature.

These dispersions may be printed on any desired dielectric substrate; the substrate is normally a prefired (sintered) alumina ceramic substrate, although the metallization can be printed on green (unfired) substrates and cofired therewith.

EXAMPLES

The following examples and comparative showings are presented to illustrate the advantages of the present invention. In the examples and elsewhere in the specification and claims, all parts, percentages, proportions, etc., are by weight, unless otherwise stated.

The vehicle used in the examples and showing below was a screen printing vehicle containing ethyl cellulose binder dissolved in a solvent of terpineols and dibutyl phthalate, plus Baker Caster Oil Co. MPA-60 (saturated long-chain castor oil polymer) flow control agent and soya lecithin wetting agent.

EXAMPLES 1 AND 2; COMPARATIVE SHOWING A

The compositions set forth in the Table were prepared, printed and fired as follows, to obtain the data also set forth in the Table.

TABLE

| | Showing A | Example 1 | Example 2 |
|---|---|---|---|
| Paste Components (wt. %): | | | |
| Pd (11 m.²/g.) | 18 | 18 | 18 |
| Ag (1.5 m.²/g.) | 45 | 45 | 45 |
| Glass powder[1] | 16 | 16 | 16 |
| NiO | — | 1 | 2 |
| Vehicle | 21 | 20 | 19 |
| Adhesion of Fired Product (p.s.i.): | | | |
| Initial | 4.5 | 6.5 | 6.0 |
| Aged (48 hr., 150°C.) | 2.0 | 4.4 | 4.7 |

[1] 10.9% PbO, 1.22% $B_2O_3$, 9.37% $SiO_2$, 2.45% CaO, 1.07% $Al_2O_3$ and 75% $Bi_2O_3$.

The respective compositions were each screen printed on a series of prefired $Al_2O_3$ substrates (which contained minor amounts of magnesium silicate and calcium silicate binders) through a patterned 200-mesh screen having nine 80 × 80-mil openings aligned in a 3 × 3 matrix. The prints were dried, and then fired in a belt furnace in two firing sequences each with 6–8 minutes at peak temperature; the first sequence was at 850°C. and the second at 760°C. This simulated a process involving a conductor fire and a resistor fire, as often occurs in hybrid microelectronics fabrication. To test the adhesion of the fired conductor to the substrate, wire leads were then attached to the fired conductor pads by placing a 20-gauge pretinned copper wire across three of the fired metallization pads and then dipping them in a solder pot (62/36/2, Sn/Pb/Ag) at 220°C. Bond strengths were then measured by pulling the soldered leads with an Instron tester. At least nine pads were pulled for each sample to obtain a representative bond strength. Results are reported in the Table in the line entitled "Initial." A second series of aged samples were similarly tested (the soldered chip with leads attached were held at 150°C. for 48 hours; results are found in the Table in the line entitled "Aged.").

The addition of NiO did not alter the solderability or solder leach performance of the resultant conductors. Initial and aged adhesion were each enhanced by NiO additions.

I claim:

1. In finely divided powders comprising noble metals useful in forming conductor patterns on dielectric substrates, the improvement of adding to such powders finely divided nickel oxide, in an amount effective to increase the adhesion of the resultant noble metal conductor pattern to the substrate.

2. Powders according to claim 1 wherein the amount of NiO is 0.1–10% by weight of the noble metal present.

3. Powders according to claim 2 wherein the amount of NiO is 1–4%.

4. Powders according to claim 1 wherein the noble metal powder is selected from among palladium, platinum, gold, and silver.

5. Powders according to claim 2 wherein the noble metal powder is selected from among palladium, platinum, gold, and silver.

6. Powders according to claim 3 wherein the noble metal powder is selected from among palladium, platinum, gold, and silver.

7. Powders according to claim 1 wherein the noble metal powder is palladium/silver.

8. Powders according to claim 2 wherein the noble metal powder is palladium/silver.

9. Powders according to claim 3 wherein the noble metal powder is palladium/silver.

10. Metallizations according to claim 1 dispersed in an inert liquid vehicle.

11. Metallizations according to claim 2 dispersed in an inert liquid vehicle.

12. Metallizations according to claim 3 dispersed in an inert liquid vehicle.

13. Metallizations according to claim 4 dispersed in an inert liquid vehicle.

14. Metallizations according to claim 7 dispersed in an inert liquid vehicle.

15. Metallizations according to claim 8 dispersed in an inert liquid vehicle.

16. Metallizations according to claim 9 dispersed in an inert liquid vehicle.

* * * * *

Disclaimer 3,854,957.—*John Robert Larry*, Youngstown, N.Y. METALLIZATIONS COMPRISING NICKEL OXIDE. Patent dated Dec. 17, 1974. Disclaimer filed Mar. 11, 1977, by the assignee, *E. I. du Pont de Nemours and Company*.

Hereby enters this disclaimer to all claims of said patent.

[*Official Gazette May 3, 1977.*]